(12) United States Patent
Chuang (10) Patent No.: US 11,252,815 B2
(45) Date of Patent: Feb. 15, 2022

(54) RADIO-FREQUENCY DEVICE AND RADIO-FREQUENCY COMPONENT THEREOF

(71) Applicant: WISTRON NEWEB CORPORATION, Hsinchu (TW)

(72) Inventor: Fu-Chi Chuang, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 302 days.

(21) Appl. No.: 16/716,784

(22) Filed: Dec. 17, 2019

(65) Prior Publication Data

US 2020/0229300 A1 Jul. 16, 2020

(30) Foreign Application Priority Data

Jan. 16, 2019 (TW) .................................. 108101663

(51) Int. Cl.
*H05K 1/02* (2006.01)
*H05K 1/11* (2006.01)

(52) U.S. Cl.
CPC ......... *H05K 1/0259* (2013.01); *H05K 1/0237* (2013.01); *H05K 1/115* (2013.01); *H05K 2201/0746* (2013.01); *H05K 2201/093* (2013.01); *H05K 2201/10098* (2013.01)

(58) Field of Classification Search
CPC ......... H05K 1/0259; H05K 2201/0746; H05K 2201/093; H05K 2201/10098

USPC ............................................................ 361/56
See application file for complete search history.

(56) References Cited

U.S. PATENT DOCUMENTS

| | | | | |
|---|---|---|---|---|
| 2006/0164309 | A1* | 7/2006 | Fujishima | H01Q 1/38 343/700 MS |
| 2006/0250731 | A1* | 11/2006 | Parkhurst | H01L 23/62 361/56 |
| 2008/0291591 | A1* | 11/2008 | Huang | H01Q 1/50 361/56 |

* cited by examiner

*Primary Examiner* — Sherman Ng
(74) *Attorney, Agent, or Firm* — McClure, Qualey & Rodack, LLP (57) ABSTRACT

A radio-frequency device and a radio-frequency component thereof are provided. The radio-frequency component includes a signal transmission line and a first electrostatic protection module coupled to the signal transmission line. The first electrostatic protection module includes a first wire layer including a first wire coupled to the signal transmission line, a first cell layer disposed corresponding to the first wire layer and including a first conductive body and a plurality of first non-conductive portions, a first grounding layer coupled to the first wire layer and the first cell layer, a first dielectric layer disposed between the first wire layer and the first cell layer, and a second dielectric layer disposed between the first cell layer and the first grounding layer. A vertical projection of the first conductive line on the first dielectric layer at least partially overlaps with that of the first cell layer on the same.

18 Claims, 10 Drawing Sheets

RADIO-FREQUENCY DEVICE AND RADIO-FREQUENCY COMPONENT THEREOF

CROSS-REFERENCE TO RELATED PATENT APPLICATION

This application claims the benefit of priority to Taiwan Patent Application No. 108101663 filed on Jan. 16, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The disclosure relates to a device and a component for transmitting radio-frequency signals, and more particularly to a radio-frequency device capable of improving surge suppression effects and a radio-frequency component thereof.

BACKGROUND OF THE DISCLOSURE

First, in the related art, if a chip (or circuit) on a radio-frequency line is intended to be protected from an impact of surge energy such as electrostatic discharge (ESD), electrostatic protection components (e.g., transient voltage suppressor (TVS)) are mostly provided to provide a low impedance path to conduct the surge energy to ground.

However, due to a further arrangement of the electrostatic protection component, a cost will be increased, and for the same reason, so will an overall volume thereof. As a result, the space on the circuit board cannot be effectively utilized.

SUMMARY OF THE DISCLOSURE

In response to the above-referenced technical inadequacies, the present disclosure provides a radio-frequency device and a radio-frequency component thereof.

In one aspect, the present disclosure provides a radio-frequency device operable over an operation frequency band. The radio-frequency device includes: a signal port, a radio-frequency circuit, a signal transmission line and a first electrostatic protection module. The signal transmission line is disposed between the signal port and the radio-frequency circuit. The first electrostatic protection module is coupled to the signal transmission line. The first electrostatic protection module includes: a first wire layer, a first cell layer, a first grounding layer, a first dielectric layer and a second dielectric layer. The first wire layer includes a first wire coupled to the signal transmission line. The first cell layer is disposed corresponding to the first wire layer and includes a first conductive body and a plurality of first non-conductive portions. The first grounding layer is coupled to the first wire layer and the first cell layer. The first dielectric layer is disposed between the first wire layer and the first cell layer. The second dielectric layer is disposed between the first cell layer and the first grounding layer. A vertical projection of the first wire on the first dielectric layer at least partially overlaps with a vertical projection of the first cell layer on the first dielectric layer.

In one aspect, the present disclosure provides a radio-frequency component operable over an operating frequency band and suitable for a radio-frequency device including a signal port and a radio-frequency circuit. The radio-frequency component includes: a signal transmission line and a first electrostatic protection module. The signal transmission line is disposed between the signal port and the radio-frequency circuit. The first electrostatic protection module is coupled to the signal transmission line. The first electrostatic protection module includes: a first wire layer, a first cell layer, a first grounding layer, a first dielectric layer and a second dielectric layer. The first wire layer includes a first wire coupled to the signal transmission line. The first cell layer is disposed corresponding to the first wire layer and includes a first conductive body and a plurality of first non-conductive portions. The first grounding layer is coupled to the first wire layer and the first cell layer. The first dielectric layer is disposed between the first wire layer and the first cell layer. The second dielectric layer is disposed between the first cell layer and the first grounding layer. A vertical projection of the first wire on the first dielectric layer at least partially overlaps with a vertical projection of the first cell layer on the first dielectric layer.

Therefore, one of the advantageous effects of the present disclosure is that, according to the radio-frequency device and the radio-frequency component thereof provided by the embodiments of the disclosure, the vertical projection of the first wire on the first dielectric layer that at least partially overlaps with the vertical projection of the first cell layer on the first dielectric layer can be utilized, so that an effect of improving a surge suppression and an effect of balancing an integrity of a high-frequency signal can be achieved.

For a further understanding of the features and techniques of the present disclosure, reference is made to the following detailed description of the disclosure and to the accompanying drawings, which, however, are provided only for purposes of reference and illustration and are not intended to limit the disclosure.

BRIEF DESCRIPTION OF THE DRAWINGS

The present disclosure will become more fully understood from the following detailed description and accompanying drawings.

DETAILED DESCRIPTION OF THE DISCLOSURE

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
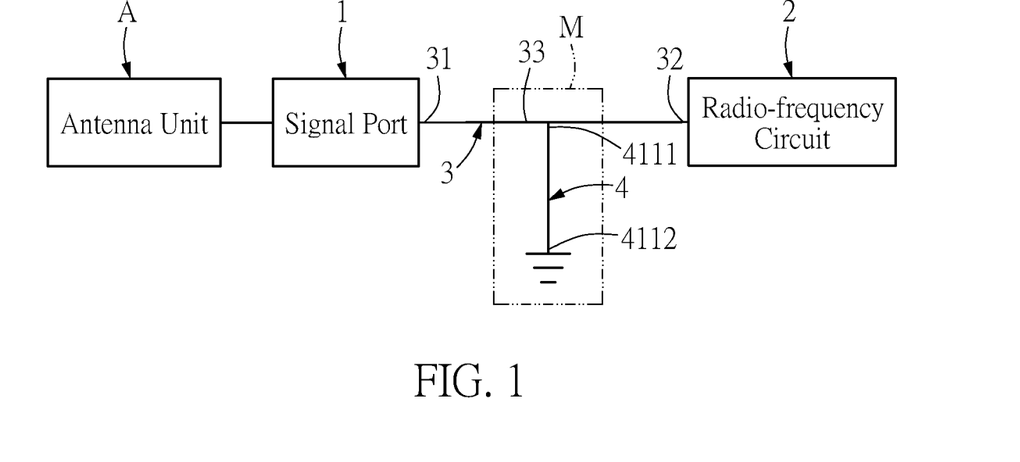
FIG. 1 is a functional block diagram of a radio-frequency device in accordance with an embodiment of the present disclosure.

Firstly, referring to FIG. 1, which is a functional block diagram of a radio-frequency device in accordance with an embodiment of the present disclosure, a first embodiment of the present disclosure provides a radio-frequency device R operable over an operating frequency band. The radio-frequency device R includes a signal port 1, a radio-frequency circuit 2, and a radio-frequency component M. The radio-frequency component M may be suitable for a radio-frequency device including a signal port 1 and a radio-frequency circuit 2, and the radio-frequency component M may include a signal transmission line 3 and a first electrostatic protection module 4 so as to provide an electrostatic protection mechanism for the radio-frequency device R by the arrangement of the first electrostatic protection module 4. Next, by way of example, as for the embodiment of the present disclosure, a frequency range (bandwidth) of the operating frequency band may be between 2.4 GHz and 2.5 GHz to produce a corresponding signal transceiving effect. Alternatively, the radio-frequency circuit 2 may be, for example, a radio-frequency chip (RF IC), a radio-frequency switch (RF SWITCH), or a chipset. However, it should be noted that the present disclosure is not limited to the frequency range of the operating frequency band of the radio-frequency device R and the form of the signal port 1, nor the form of the radio-frequency circuit 2.

As previously described, referring back to FIG. 1, in other aspects, the signal port 1 may be used to connect with an antenna or other conductive objects (e.g., coaxial cables or conductive joints, etc.). In addition, the radio-frequency device R may further include an antenna unit A, and the signal port 1 can be coupled so as to transmit signals between the antenna unit A and the radio-frequency circuit 2. In addition, it should be noted that in other aspects, the signal port 1 may also be an end by means of which an antenna element A is connected to the end of the radio-frequency component M.

Figure 2:
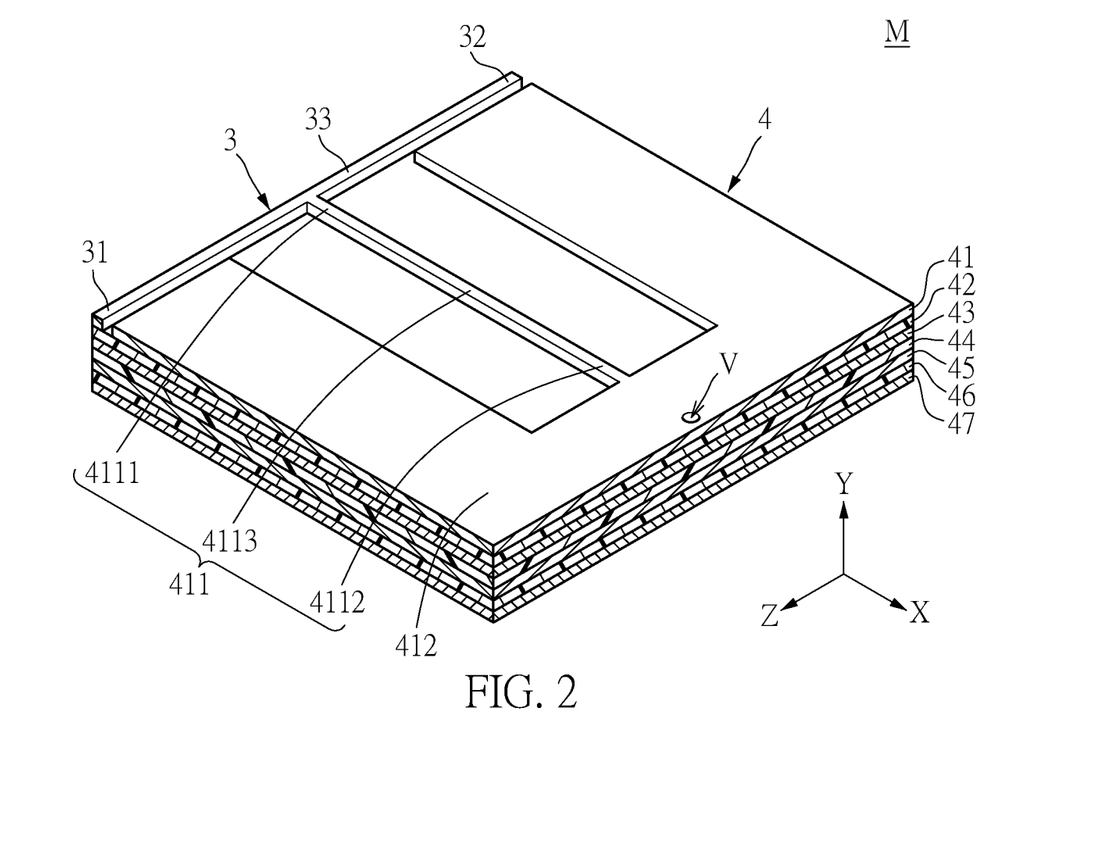
FIG. 2 is a schematic assembled perspective view of a radio-frequency component according to a first embodiment of the present disclosure.
Figure 3:
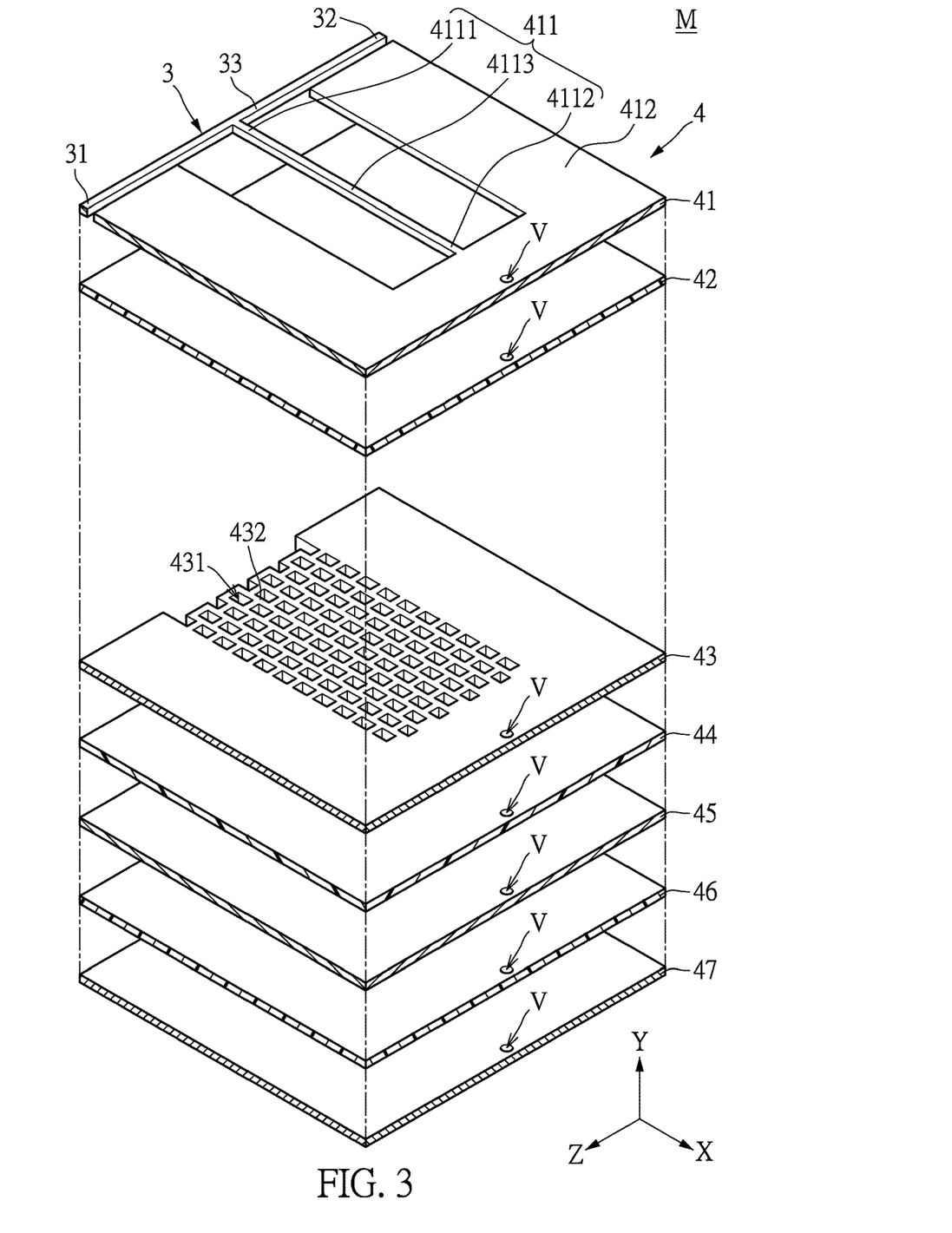
FIG. 3 is a schematic exploded perspective view of the radio-frequency component according to the first embodiment of the present disclosure.
Figure 4:
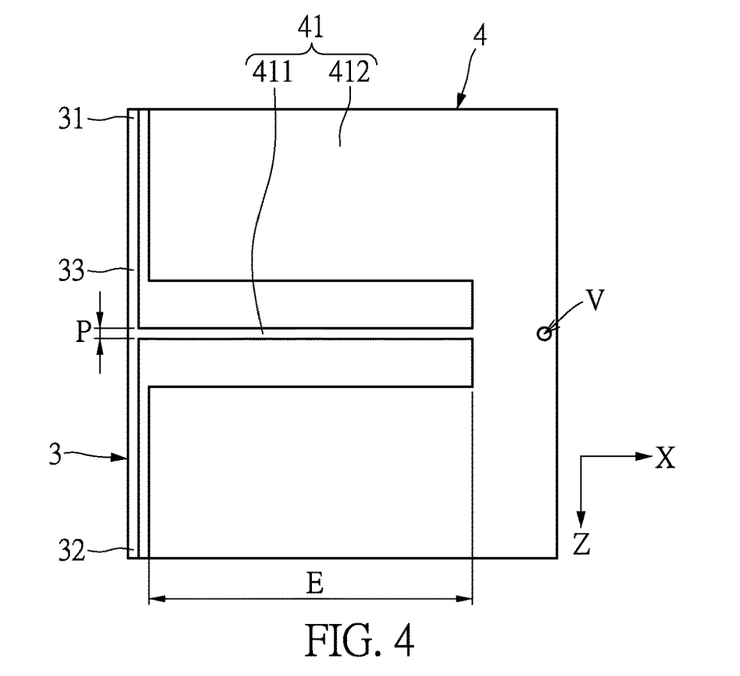
FIG. 4 is a schematic top view of the radio-frequency component of the first embodiment of the present disclosure.

As described above, referring back to FIG. 1 as well as FIGS. 2 to 4, FIGS. 2 and 3 are respectively a schematic assembled perspective view and a schematic exploded perspective view of a radio-frequency component according to the first embodiment of the present disclosure, and FIG. 4 is a schematic top view of the radio-frequency component according to the first embodiment of the present disclosure. The signal transmission line 3 may be disposed between the signal port 1 and the radio-frequency circuit 2, and the signal transmission line 3 may include a first end 31 connected to the signal port 1, a second end 32 connected to the radio-frequency circuit 2, and a connecting portion 33 disposed between the first end 31 and the second end 32. The first electrostatic protection module 4 may be coupled to the connecting portion 33 of the signal transmission line 3. In addition, it should be noted that "coupling" throughout this disclosure may be a direct or indirect connection, or a direct or indirect electrical connection, and the present disclosure is not limited thereto.

As described above, referring back to FIGS. 2 to 4, the first electrostatic protection module 4 may include a first wire layer 41, a first dielectric layer 42, a first cell layer 43, a second dielectric layer 44, and a first grounding layer 45. Preferably, the first electrostatic protection module 4 may further include a third dielectric layer 46 and a second grounding layer 47. It should be noted that the first electrostatic protection module 4 may be a multi-layer plate structure, for example, a copper foil substrate made of epoxy glass fiber substrates (FR-4) or Rogers, although the present disclosure is not limited thereto. As for aspects of FIGS. 2 and 3, the first electrostatic protection module 4 may be of a four-layer plate structure. Thereby, the first wire layer 41 and the signal transmission line 3 may be one layer of metal conductors (e.g., copper foil in a copper foil substrate), and the signal transmission line 3 may be a microstrip line. In addition, the first cell layer 43, the first grounding layer 45, and the second grounding layer 47 may each be one layer of copper foils in a copper foil substrate, respectively. In addition, the first dielectric layer 42, the second dielectric layer 44, and the third dielectric layer 46 may be insulating plates for insulating each layer of copper foil. Thus, when the first electrostatic protection module 4 may be a four-layer plate structure, the first electrostatic protection module 4 may be formed by sequentially stacking the first wire layer 41, the first dielectric layer 42, the first cell layer 43, the second dielectric layer 44, the first grounding layer 45, the third dielectric layer 46, and the second grounding layer 47. However, it should be noted that the present disclosure is not limited to the above-mentioned examples, and in other embodiments, the first electrostatic protection module 4 may also be composed of only the first wire layer 41, the first dielectric layer 42, the first cell layer 43, the second dielectric layer 44, and the first grounding layer 45.

As described above, referring back to FIGS. 2 to 4, the first wire layer 41 may include a first wire 411 and a first grounding portion 412. The first wire 411 may be a microstrip line coupled to a signal transmission line 3, and may be coupled between the signal transmission line 3 and the first grounding portion 412. In addition, according to the present disclosure, an impedance of the first wire 411 of the first electrostatic protection module 4 can be equal to that of the signal transmission line 3, that is, the first wire 411 has the same impedance as the signal transmission line 3. For example, if the impedance of the signal transmission line 3 is 50 Ohms, the impedance of the first wire 411 is also equal to 50 Ohms. Further, the first wire 411 may include a first connecting end 4111 coupled to the signal transmission line 3, a first grounding end 4112 corresponding to the first connecting end 4111 and coupled to the first grounding portion 412, and a first wire body 4113 connected between the first connecting end 4111 and the first grounding end 4112. An electrical length E may be defined between the first connecting end 4111 and the first grounding end 4112, and the electrical length E may be less than ¼ times of a wavelength corresponding to a lowest operating frequency over the operating frequency band. For example, since the frequency range of the operating frequency band of the embodiment of the present disclosure may be between 2.4 GHz and 2.5 GHz, the electrical length E between the first connecting end 4111 and the first grounding end 4112 of the first wire 411 may be calculated using 2.4 GHz as a parameter. Meanwhile, a dielectric coefficient of the copper foil substrate can be further calculated as a parameter. In addition, according to the embodiment of the present disclosure, the FR-4 copper foil substrate used may have a dielectric coefficient of 4.2-4.7, although the present disclosure is not limited thereto. In addition, it should be specifically noted that, for clarity of the drawings, labeled positions of the first end 31, the second end 32, the first connecting end 4111 and the first grounding end 4112 are merely illustrative, and measured positions of the electrical length E are well known to those skilled in the art and will not be described in detail herein.

As described above, referring back to FIGS. 2 and 3, the first dielectric layer 42 may further be disposed between the first wire layer 41 and the first cell layer 43. The first grounding layer 45 may be coupled to the first grounding portion 412 of the first wire layer 41 and the first cell layer 43, and the second dielectric layer 44 may be disposed between the first cell layer 43 and the first grounding layer 45. The second grounding layer 47 may be coupled to the first grounding layer 45, and the third dielectric layer 46 may be disposed between the first grounding layer 45 and the second grounding layer 47. Further, the first wire layer 41, the first cell layer 43, the first grounding layer 45, and the second grounding layer 47 are coupled to each other. For example, the first dielectric layer 42, the second dielectric layer 44, and the third dielectric layer 46 may be provided with at least one via hole V respectively, and the first wire layer 41, the first cell layer 43, the first grounding layer 45, and the second grounding layer 47 may be coupled to each other by electrical conductors (not shown) in the via hole V.

It should be noted that it is a technique well known to those skilled in the art to provide electric conductors in the via holes V so as to electrically connect components respectively provided on two opposite surfaces, and will not be described in detail herein. Also, in other aspects, an arrangement of the via hole V may be replaced by a conductive pillar, and the disclosure is not limited thereto.

As described above, referring back to FIGS. 2 to 5, FIG. 5 is a schematic top perspective view of the radio-frequency component in accordance with a first embodiment of the present disclosure. The first cell layer 43 may be disposed corresponding to the first wire layer 41, and may include a first conductive body 432 and a plurality of first non-conductive portions 431. In addition, a vertical projection of the first wire 411 on the first dielectric layer 42 at least partially or completely overlaps with a vertical projection of the first cell layer 43 on the first dielectric layer 42. For example, a surface area of a projected area formed by the vertical projection of the first cell layer 43 on the first dielectric layer 42 may be greater than or equal to that of a projected area formed by the vertical projection of the first wire 411 on the first dielectric layer 42.

Figure 5:
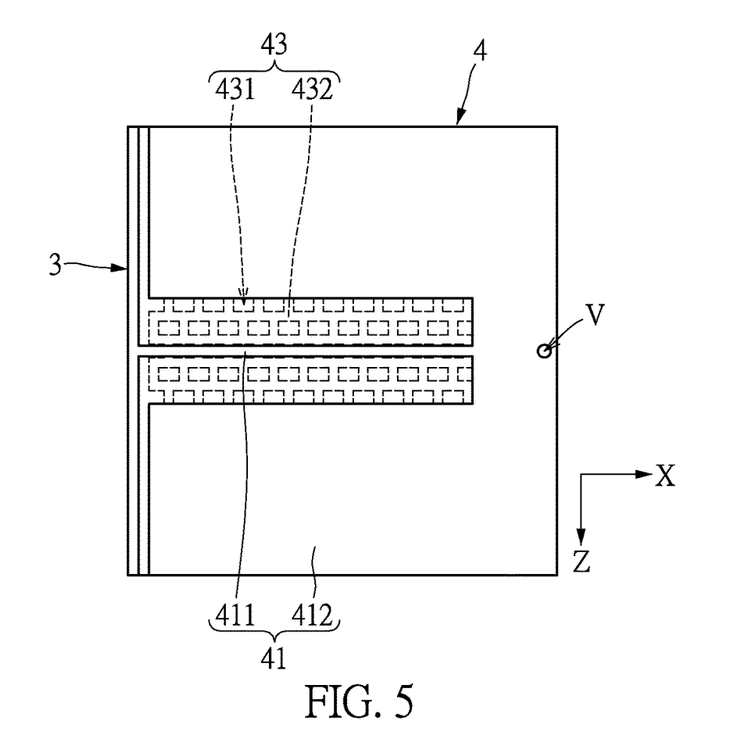
FIG. 5 is a schematic top perspective view of the radio-frequency component of the first embodiment of the present disclosure.

As described above, referring back to FIGS. 2 to 5, further, a vertical projection of the first conductive body 432 of the first cell layer 43 on the first dielectric layer 42 can form a first projection area, a vertical projection of the plurality of first non-conductive portions 431 of the first cell layer 43 on the first dielectric layer 42 can form a second projection area, and the vertical projection of the first wire 411 on the first dielectric layer 42 can form a third projection area. In addition, the third projection area at least partially overlaps with the first projection area and partially overlaps with the second projection area simultaneously, or completely overlaps with the first projection area and completely overlaps with the second projection area simultaneously. In other words, the third projection area at least partially overlaps with the first projection area, and the third projection area at least partially overlaps with the second projection area. Thereby, as shown in FIGS. 4 and 5, the first wire 411 may cover both the first conductive body 432 and the first non-conductive portion 431 simultaneously. In addition, it should be noted that, by way of example, the third projection region at least partially overlaps with the first projection region and partially with the second projection region at the same time in the drawings, although the disclosure is not limited thereto. Furthermore, it should be noted that, preferably, as for the embodiment of the present disclosure, the third projection region formed by the vertical projection of the first wire 411 on the first dielectric layer 42 can partially overlap with the second projection region formed by a vertical projection of at least three or more first non-conductive portions 431 on the first dielectric layer 42.

Figure 6:
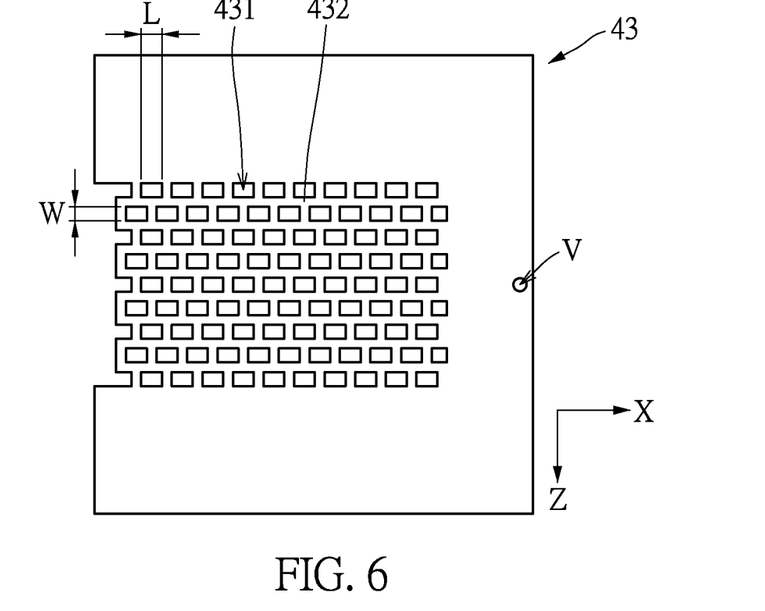
FIG. 6 is a schematic top view of one of aspects of a first cell layer of the radio-frequency component of the first embodiment of the present disclosure.

Next, referring to FIG. 6, FIG. 6 is a schematic top view of one of the aspects of the first cell layer of the radio-frequency component of the first embodiment of the present disclosure. As for the present disclosure, the first non-conductive portions 431 may be openings formed through the first conductive body 432, and the plurality of first non-conductive portions 431 of the first cell layer 43 are arranged in a matrix manner. Thereby, the first cell layer 43 may be in the form of a grid-like plate body. It should be noted that although the first non-conductive portion 431 of the first cell layer 43 is illustrated as a rectangular shape by way of example, however, in other aspects, the first non-conductive portion 431 may have a circular, elliptical, diamond, triangular, or other polygonal configurations, and the present disclosure is not limited thereto. In addition, it should be noted that although an opening is shown as the first non-conductive portion 431 in the drawings, however, in other embodiments, a dielectric body may be provided in the first non-conductive portion 431 in the shape of an opening due to an influence of a manufacturing process of the copper foil substrate. In other words, the first dielectric layer 42 or the second dielectric layer 44 may have protrusions (not shown) thereon corresponding to the plurality of first non-conductive portions 431 so that the protrusions of the first dielectric layer 42 are stuffed in the first non-conductive portions 431 in the shape of openings, although the present disclosure is not limited thereto.

As described above, referring back to FIG. 6, further, the first non-conductive portions 431 of the first cell layer 43 may each have a rectangular shape, and the first non-conductive portions 431 may each include a predetermined width W and a predetermined length L. Furthermore, for example, an extension direction (e.g., X direction) of the predetermined length L may be parallel to an extension direction (e.g., X direction) of the first wire 411, and an extension direction (e.g., Z direction) of the predetermined width W may be perpendicular to an extension direction (e.g., X direction) of the first wire 411. Further, as for the present disclosure, the predetermined length L may be greater than or equal to the predetermined width W, and a ratio of the predetermined length L to the predetermined width W may be between 1 and 5. In other words, the first non-conductive portion 431 of the first cell layer 43 may have a square shape or a rectangular shape, although the present disclosure is not limited thereto. Further, the predetermined width W of the first non-conductive portion 431 may be less than ⅛ times of the wavelength corresponding to the lowest operating frequency over the operating frequency band. For example, since the frequency range of the operating frequency band of the embodiment of the present disclosure may be between 2.4 GHz and 2.5 GHz, the predetermined width W of the first non-conductive portion 431 may be calculated using 2.4 GHz as a parameter. Furthermore, preferably, the predetermined width W may be less than 1/20 times of the wavelength corresponding to the lowest operating frequency over the operating frequency band. Thereby, a return loss of the antenna element A can be improved by a size limitation of the predetermined width W and the predetermined length L as described above.

As described above, referring back to FIGS. 4 to 6, it should be noted that, according to an embodiment of the present disclosure, the first wire 411 may include a wire width P. The wire width P may be smaller than the predetermined width W of the first non-conductive portion 431. In other words, the first wire 411 will only cover a portion of the first non-conductive portion 431. In addition, it should be noted that, as for the embodiment of the present disclosure, the first dielectric layer 42, the second dielectric layer 44, the third dielectric layer, the first grounding layer 45, and the second grounding layer 47 may not have openings corresponding to the plurality of first non-conductive portions 431. In other words, for the embodiment of the present disclosure, only the first cell layer 43 has a plurality of openings.

Figure 7:
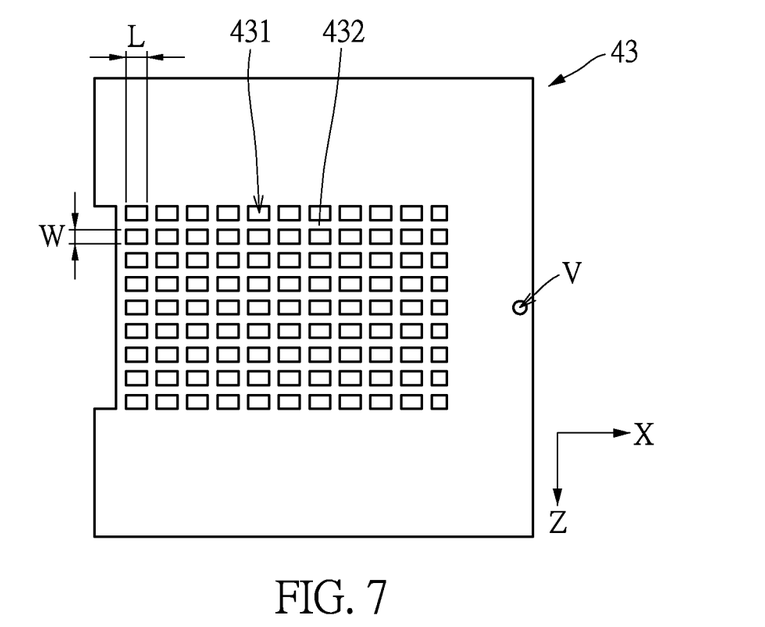
FIG. 7 is a schematic top view of another aspect of the first cell layer of the radio-frequency component of the first embodiment of the present disclosure.

Next, with reference to FIG. 7, FIG. 7 is a schematic top view of another aspect of the first cell layer of the radio-frequency component of the first embodiment of the present disclosure. As can be seen from comparing FIG. 6 to FIG. 7, the biggest difference between the aspect of the first cell layer 43 of FIG. 7 and the aspect of the first cell layer 43 of FIG. 6 exists in an arrangement of the first non-conductive portions 431. According to the aspect of FIG. 6, the plurality of first non-conductive portions 431 can be arranged in an array and provided in a staggered manner. In other words, the plurality of first non-conductive portions 431 may be arranged in a plurality of rows in sequence, and two adjacent rows of first non-conductive portions 431 are arranged in a staggered manner. In addition, according to the aspect of FIG. 7, two adjacent rows of first non-conductive portions 431 are arranged in alignment. However, it should be noted that the present disclosure is not limited by the arrangement of the first non-conductive portions 431.

Second Embodiment

Figure 8:
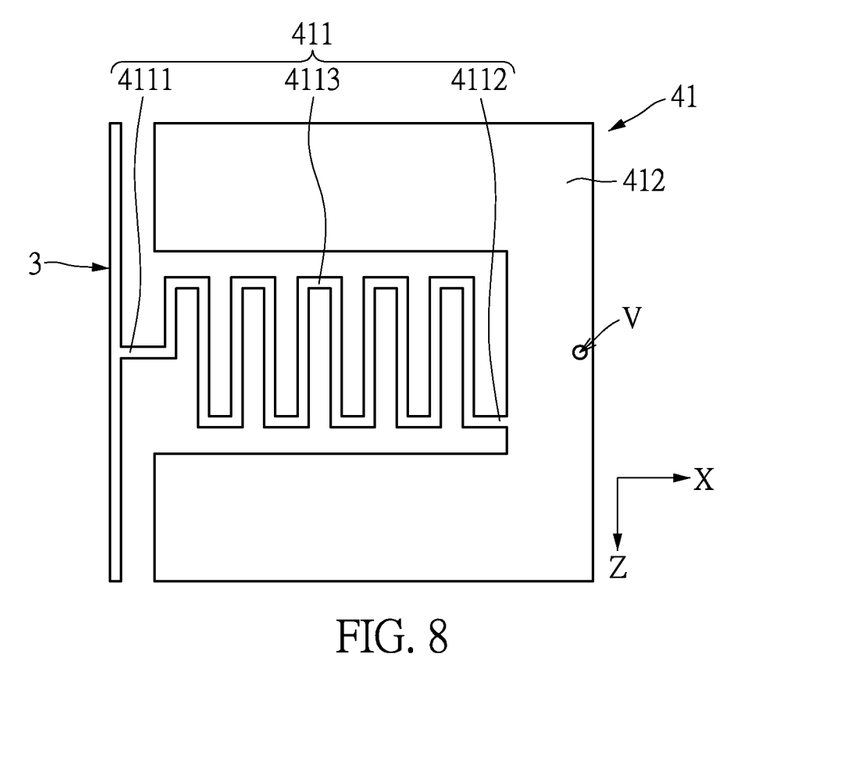
FIG. 8 is a schematic top view of the radio-frequency component of a second embodiment of the present disclosure.
Figure 9:
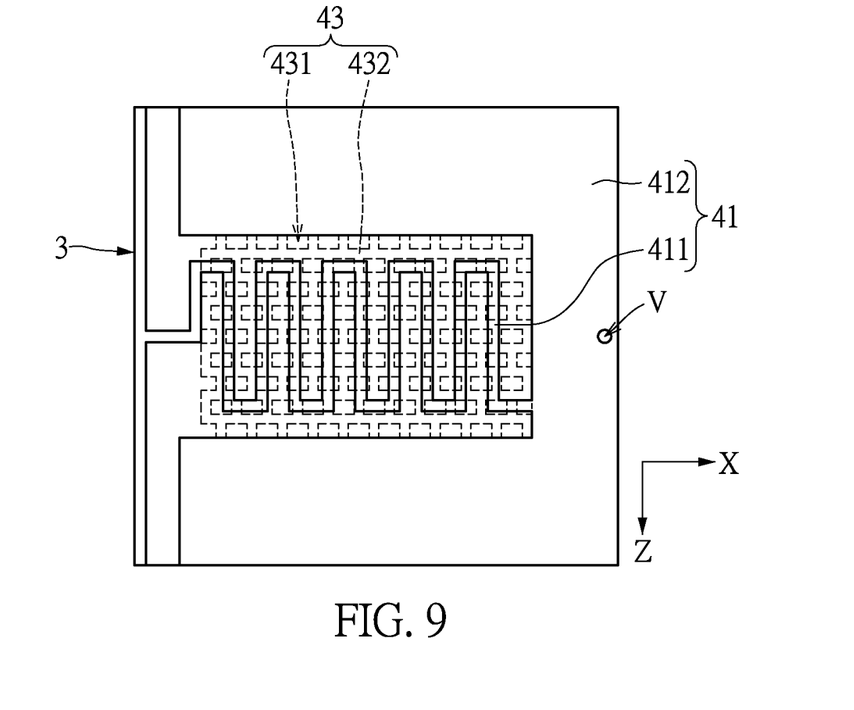
FIG. 9 is a schematic top perspective view of the radio-frequency component of FIG. 8.

Next, referring to FIGS. 8 and 9, FIG. 8 is a schematic top view of the radio-frequency component according to a second embodiment of the present disclosure; FIG. 9 is a schematic top perspective view of the radio-frequency component of FIG. 8. As can be seen from comparing FIG. 8 to FIG. 4, the greatest difference between the second embodiment and the first embodiment is that: the first wire 411 of the first wire layer 41 in the aspect of FIG. 8 is in a winding shape (e.g., a sinuous shape), however, the first wire 411 of the first wire layer 41 in the aspect of FIG. 4 is in the shape of a straight strip. In addition, it should be noted that other configurations of the radio-frequency component M of the radio-frequency device R provided by the second embodiment are similar to those of the afore-mentioned embodiment, and detailed description thereof will be omitted herein.

As described above, as shown in FIG. 8, in detail, the first wire 411 includes a first connecting end 4111 coupled to the signal transmission line 3, a first grounding end 4112 corresponding to the first connecting end 4111 and coupled to the first grounding portion 412, and a first wire body 4113 having a winding shape connected between the first connecting end 4111 and the first grounding end 4112.

As described above, with respect to the aspect of FIG. 8, in a case where the electrical length E is less than ¼ times of the wavelength corresponding to the lowest operating frequency over the operating frequency band, a size of the first electrostatic protection module 4 can be reduced in the second embodiment in which the first wire body 4113 is in the winding shape, as compared to the first embodiment in which the first wire body 4113 is in the shape of a straight bar. In other words, the size of the first electrostatic protection module 4 can be reduced by configuring the first wire body 4113 to be in the winding shape.

Figure 10:
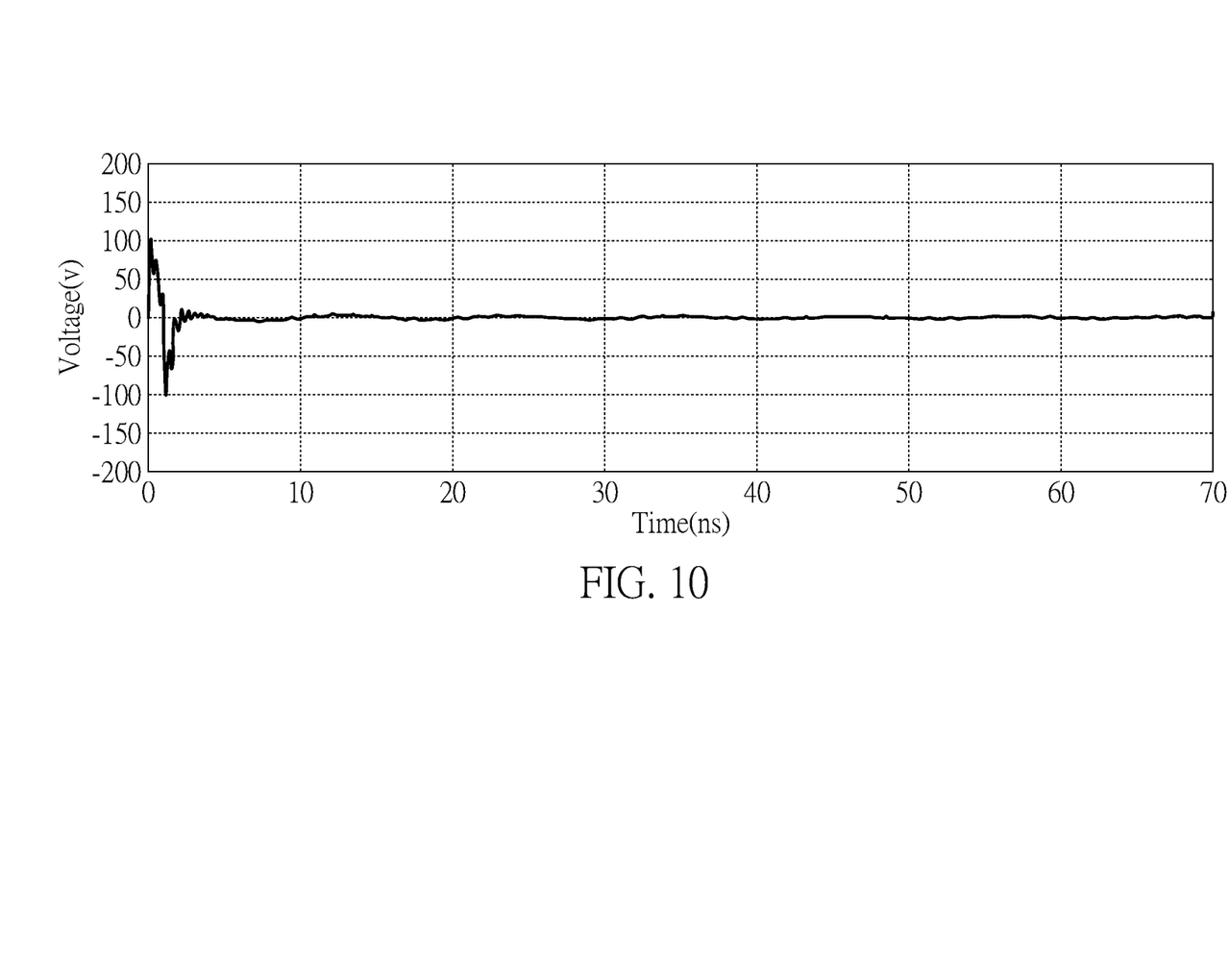
FIG. 10 is a discharge waveform diagram of an ESD test of the radio-frequency component of FIG. 9.

Next, referring to FIG. 1 and FIG. 10, FIG. 10 is a discharge waveform diagram of an ESD test of the radio-frequency component of FIG. 9. According to the aspect of FIG. 9, when the antenna unit A receives an electrostatic discharge (ESD) voltage of 4K volts, FIG. 10 shows that an electrostatic discharge waveform diagram is suppressed by an arrangement of the first electrostatic protection module 4. Thereby, as shown in FIG. 10, the voltage can be reduced to be under 100 volts. In addition, it should be noted that in the aspect shown in FIG. 1, an effect of suppressing the electrostatic discharge is also achieved.

Third Embodiment

Figure 11:
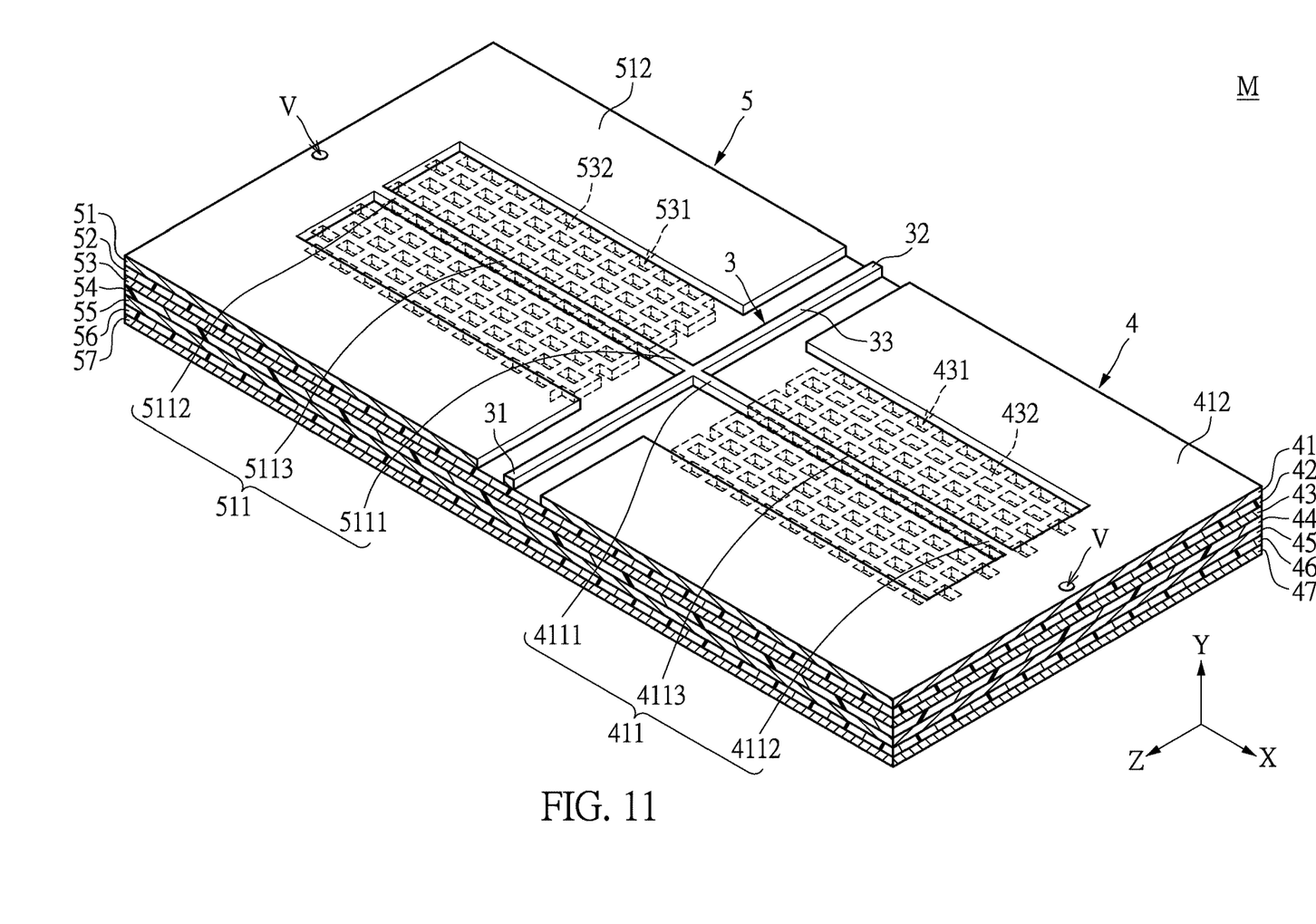
FIG. 11 is a schematic assembled perspective view of the radio-frequency component according to a third embodiment of the present disclosure.
Figure 12:
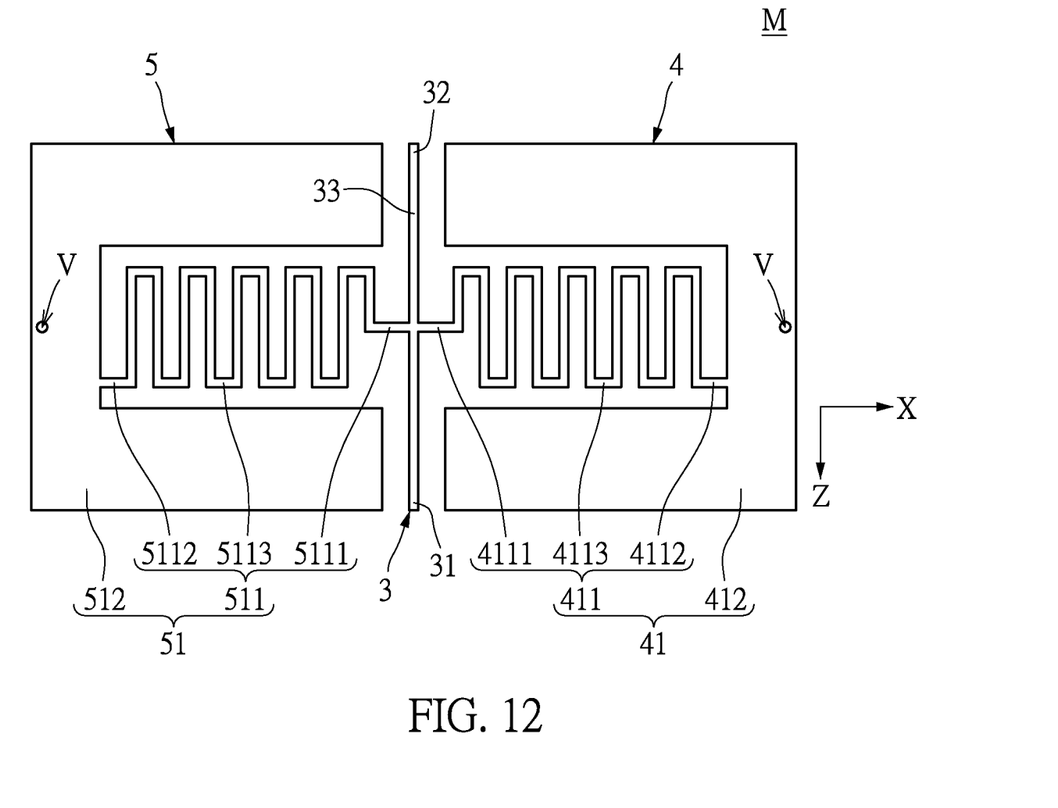
FIG. 12 is a schematic top view of the radio-frequency component according to the third embodiment of the present disclosure.

First, referring to FIGS. 11 and 12, FIG. 11 is a schematic assembled perspective view of the radio-frequency component according to a third embodiment of the present disclosure, and FIG. 12 is a schematic top view of the radio-frequency component according to a third embodiment of the present disclosure. As can be seen from comparing FIGS. 11 and 12 with FIGS. 2 and 4, the radio-frequency device R in the aspects of FIGS. 12 and 13 further include a second electrostatic protection module 5 coupled to the signal transmission line 3. In addition, it should be noted that other configurations of the radio-frequency component M of the radio-frequency device R provided by the second embodiment are similar to those of the previously mentioned embodiment, and further description thereof will be omitted.

As described above, referring back to FIGS. 11 and 12, the second electrostatic protection module 5 may include a second wire layer 51, a second cell layer 53, a third grounding layer 55, a fourth dielectric layer 52, and a fifth dielectric layer 54. Preferably, the second electrostatic protection module 5 may further include a sixth dielectric layer 56 and a fourth grounding layer 57. It should be noted that the second electrostatic protection module 5 may be a multi-layer plate structure (e.g., formed of a copper foil substrate). Thereby, the second wire layer 51, the second cell layer 53, the third grounding layer 55, the fourth dielectric layer 52, the fifth dielectric layer 54, the sixth dielectric layer 56, and the fourth grounding layer 57 may be sequentially stacked.

Further referring to FIGS. 11 and 12, the second wire layer 51 may include a second wire 511 coupled to the signal transmission line 3 and a second grounding portion 512 coupled to the second wire 511. Further, the second wire 511 may include a second connecting end 5111 coupled to the signal transmission line 3, a second grounding end 5112 corresponding to the second connecting end 5111 and coupled to the second grounding portion 512, and a second wire body 5113 connected between the second connecting end 5111 and the second grounding end 5112. The second cell layer 53 may be disposed corresponding to the second wire layer 51, and may include a second conductive body 532 and a plurality of second non-conductive portions 531. Further, a third grounding layer 55 may be coupled to the second wire layer 51 and the second cell layer 53, a fourth dielectric layer 52 may be disposed between the second wire layer 51 and the second cell layer 53, and a fifth dielectric layer may be disposed between the second cell layer 53 and the third grounding layer 55. Further, a vertical projection of the second wire 511 on the fourth dielectric layer 52 at least partially or completely overlaps with a vertical projection of the second cell layer 53 on the fourth dielectric layer 52. Still further, a fourth grounding layer 57 may be coupled to the third grounding layer 55, and a sixth dielectric layer 56 may be disposed between the third grounding layer 55 and the fourth grounding layer 57. In addition, the second wire layer 51, the second cell layer 53, the third grounding layer 55, and the fourth grounding layer 57 may be coupled to each other. For example, the second wire layer 51, the second cell layer 53, the third grounding layer 55, and the fourth grounding layer 57 may be provided with at least one via hole V respectively, by which the second wire layer 51, the second cell layer 53, the third grounding layer 55, and the fourth grounding layer 57 may be coupled to each other. Thereby, the second wire layer 51, the second cell layer 53, the third grounding layer 55, and the fourth grounding layer 57 can be electrically connected to each other by electrical conductors (not shown) in the via hole V.

In addition, it should be noted that a structure of the second electrostatic protection module 5 is similar to that of the first electrostatic protection module 4, in other words, structure characteristics of the second wire layer 51, the fourth dielectric layer 52, the second cell layer 53, the fifth dielectric layer 54, the third grounding layer 55, the sixth dielectric layer 56, and the fourth grounding layer 57 of the second electrostatic protection module 5 are similar to that of the first wire layer 41 and the first dielectric layer 42, the first cell layer 43, the second dielectric layer 44, the first grounding layer 45, the third dielectric layer 46, and the second grounding layer 47 of the first electrostatic protection module 4; therefore, further description thereof will be omitted. Further, it should be noted that in the aspect of FIGS. 12 and 13, the first electrostatic protection module 4 and the second electrostatic protection module 5 may be formed of the same copper foil substrate, although the present disclosure is not limited thereto.

Figure 13:
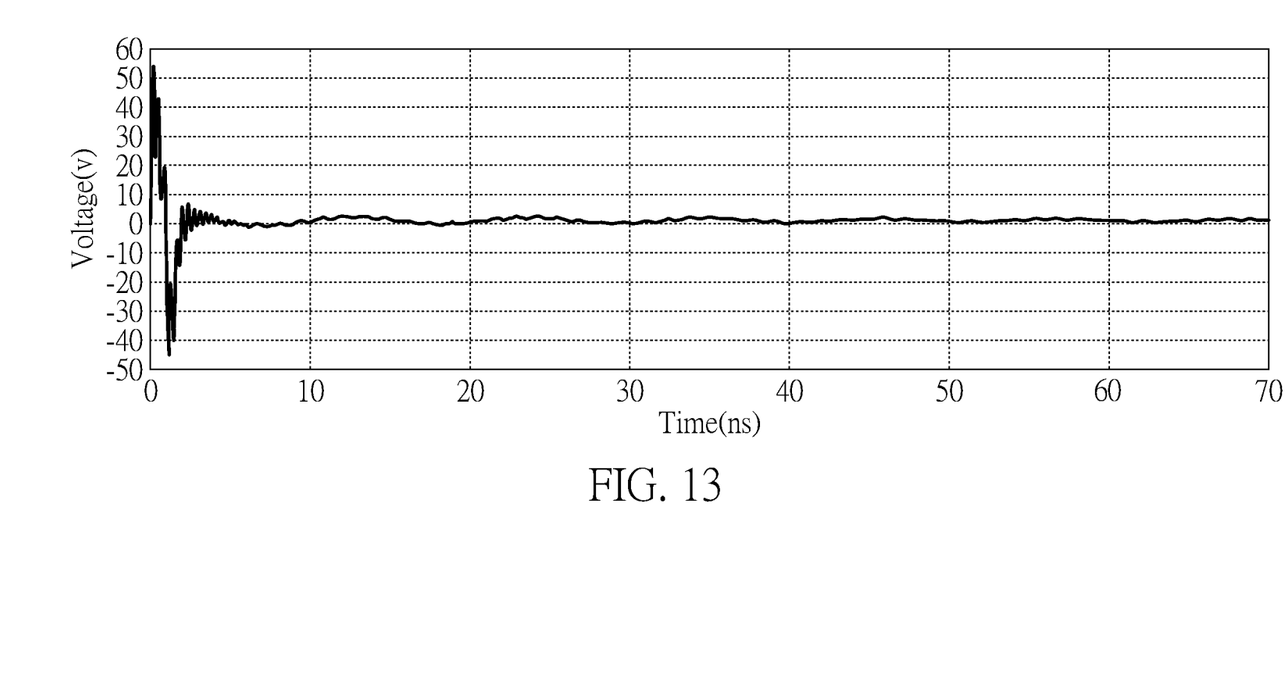
FIG. 13 is a discharge waveform diagram of an ESD test of the radio-frequency component of FIG. 11.

Next, referring to FIG. 13, FIG. 13 is a discharge waveform diagram of an ESD test of the radio-frequency component of FIG. 12. In other words, FIG. 13 is a waveform diagram in which electrostatic discharge is suppressed by the arrangement of the first electrostatic protection module 4 and the second electrostatic protection module 5 when the antenna unit A receives an electrostatic discharge voltage of 4 kV. Thereby, as can be seen from comparing FIG. 13 to FIG. 10, when the radio-frequency component M further includes the second electrostatic protection module 5, half of the electrostatic discharge voltage can be further reduced. That is, as shown in FIG. 13, the voltage may drop to under 50 volts.

Advantageous Effects of the Embodiments

One of the advantageous effects of the present disclosure resides in that, according to the radio-frequency device and the radio-frequency component thereof provided by the embodiments of the disclosure, the technical scheme that the vertical projection of the first wire 411 on the first dielectric layer 42 at least partially overlaps with the vertical projection of the first cell layer 43 on the first dielectric layer 42 can be utilized, so that an effect of improving a surge suppression and a performance of a high-frequency signal can be achieved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A radio-frequency device operable over an operating frequency band, comprising:
　a signal port;
　a radio-frequency circuit;
　a signal transmission line disposed between the signal port and the radio-frequency circuit; and
　a first electrostatic protection module coupled to the signal transmission line, including:
　　a first wire layer including a first wire coupled to the signal transmission line;
　　a first cell layer disposed corresponding to the first wire layer, wherein the first cell layer includes a first conductive body and a plurality of first non-conductive portions;

a first grounding layer coupled to the first wire layer and the first cell layer;
a first dielectric layer disposed between the first wire layer and the first cell layer; and
a second dielectric layer disposed between the first cell layer and the first grounding layer;
wherein a vertical projection of the first wire on the first dielectric layer at least partially overlaps with a vertical projection of the first cell layer on the first dielectric layer.

2. The radio-frequency device according to claim 1, wherein the first electrostatic protection module further includes a second grounding layer coupled to the first grounding layer and a third dielectric layer disposed between the first grounding layer and the second grounding layer.

3. The radio-frequency device according to claim 1, wherein the first wire layer further includes a first grounding portion, the first wire is coupled between the signal transmission line and the first grounding portion, and the first grounding layer is coupled to the first grounding portion of the first wire layer and the first cell layer.

4. The radio-frequency device according to claim 1, further comprising: a second electrostatic protection module coupled to the signal transmission line and including a second wire layer, a second cell layer, a third grounding layer, a fourth dielectric layer, and a fifth dielectric layer; wherein the second wire layer includes a second wire coupled to the signal transmission line, the second cell layer is disposed corresponding to the second wire layer and includes a second conductive body and a plurality of second non-conductive portions, the third grounding layer is coupled to the second wire layer and the second cell layer, the fourth dielectric layer is disposed between the second wire layer and the second cell layer, and the fifth dielectric layer is disposed between the second cell layer and the third grounding layer; wherein a vertical projection of the second wire on the fourth dielectric layer at least partially overlaps with a vertical projection of the second cell layer on the fourth dielectric layer.

5. The radio-frequency device according to claim 1, wherein the first wire of the first electrostatic protection module includes a first connecting end coupled to the signal transmission line and a first grounding end corresponding to the first connecting end, an electrical length is defined between the first connecting end and the first grounding end, and the electrical length is less than ¼ times of a wavelength corresponding to a lowest operating frequency over the operating frequency band.

6. The radio-frequency device according to claim 1, wherein the first wire of the first electrostatic protection module includes a first connecting end coupled to the signal transmission line, a first grounding end corresponding to the first connecting end, and a first wire body having a winding shape connected between the first connecting end and the first grounding end.

7. The radio-frequency device according to claim 1, wherein an impedance of the first wire is equal to that of the signal transmission line.

8. The radio-frequency device according to claim 1, wherein the first non-conductive portions of the first cell layer each include a predetermined width that is less than ⅛ times of a wavelength corresponding to a lowest operating frequency over the operating frequency band.

9. The radio-frequency device according to claim 8, wherein the first non-conductive portions of the first cell layer are rectangular, and the first non-conductive portion includes a predetermined length, which is greater than or equal to the predetermined width.

10. The radio-frequency device according to claim 9, wherein a ratio of the predetermined length to the predetermined width is between 1 and 5, an extension direction of the predetermined length is parallel to that of the first wire, and the extension direction of the predetermined width is perpendicular to that of the first wire.

11. The radio-frequency device according to claim 9, wherein the first wire includes a wire width that is smaller than the predetermined width.

12. The radio-frequency device according to claim 1, wherein a vertical projection of the first conductive body of the first cell layer on the first dielectric layer can form a first projection area, a vertical projection of the first non-conductive portion of the first cell layer on the first dielectric layer can form a second projection area, and the vertical projection of the first wire on the first dielectric layer can form a third projection area; wherein the third projection region at least partially overlaps with the first projection region and at least partially overlaps with the second projection region.

13. A radio-frequency component being operable on an operating frequency band and being suitable for a radio-frequency device including a signal port and a radio-frequency circuit, comprising:
a signal transmission line disposed between the signal port and the radio-frequency circuit; and
a first electrostatic protection module coupled to the signal transmission line, the first electrostatic protection module, including:
a first wire layer including a first wire;
a first cell layer including a first conductive body and a plurality of first non-conductive portions;
a first grounding layer coupled to the first wire layer and the first cell layer;
a first dielectric layer disposed between the first wire layer and the first cell layer; and
a second dielectric layer disposed between the first cell layer and the first grounding layer;
wherein a vertical projection of the first wire on the first dielectric layer at least partially overlaps with a vertical projection of the first cell layer on the first dielectric layer.

14. The radio-frequency component according to claim 13, wherein the first electrostatic protection module further includes a second grounding layer coupled to the first grounding layer and a third dielectric layer disposed between the first grounding layer and the second grounding layer.

15. The radio-frequency component according to claim 13, further comprising: a second electrostatic protection module coupled to the signal transmission line and including a second wire layer, a second cell layer, a third grounding layer, a fourth dielectric layer, and a fifth dielectric layer; wherein the second wire layer includes a second wire coupled to the signal transmission line and is disposed corresponding to the second wire layer, the second cell layer includes a second conductive body and a plurality of second non-conductive portions, the third grounding layer is coupled to the second wire layer and the second cell layer, the fourth dielectric layer is disposed between the second wire layer and the second cell layer, and the fifth dielectric layer is disposed between the second cell layer and the third grounding layer; wherein a vertical projection of the second wire on the fourth dielectric layer at least partially overlaps with a vertical projection of the second cell layer on the fourth dielectric layer.

16. The radio-frequency component according to claim 13, wherein a vertical projection of the first conductive body of the first cell layer on the first dielectric layer can form a first projection area, a vertical projection of the first non-conductive portion of the first cell layer on the first dielectric layer can form a second projection area, and a vertical projection of the first conductive line on the first dielectric layer can form a third projection area; wherein the third projection region at least partially overlaps with the first projection region and at least partially overlaps with the second projection region.

17. The radio-frequency component according to claim 13, wherein the first non-conductive portions of the first cell layer respectively include a predetermined width that is less than $\frac{1}{8}$ times of a wavelength corresponding to a lowest operating frequency over the operating frequency band.

18. The radio-frequency component according to claim 17, wherein the first wire includes a wire width that is smaller than the predetermined width.

\* \* \* \* \*